(12) United States Patent
Boyce (10) Patent No.: US 7,577,876 B2
(45) Date of Patent: Aug. 18, 2009

(54) DEBUG SYSTEM FOR DATA TRACKING

(75) Inventor: Douglas G. Boyce, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 570 days.

(21) Appl. No.: 11/169,208

(22) Filed: Jun. 28, 2005

(65) Prior Publication Data

US 2007/0011517 A1 Jan. 11, 2007

(51) Int. Cl.
*G06F 11/25* (2006.01)
(52) U.S. Cl. .............................. 714/39; 714/37; 714/45
(58) Field of Classification Search .................. 714/39, 714/37
See application file for complete search history.

(56) References Cited

U.S. PATENT DOCUMENTS

| | | | | |
|---|---|---|---|---|
| 4,636,940 A * | 1/1987 | Goodwin, Jr. ............... | 717/128 |
| 5,450,349 A * | 9/1995 | Brown et al. ................... | 714/27 |
| 5,608,866 A * | 3/1997 | Horikawa ..................... | 714/39 |
| 5,835,702 A * | 11/1998 | Levine et al. ................. | 714/39 |
| 6,134,676 A * | 10/2000 | VanHuben et al. ............ | 714/39 |
| 6,389,558 B1 * | 5/2002 | Herrmann et al. ............. | 714/39 |
| 6,484,274 B1 * | 11/2002 | Lee et al. ....................... | 714/38 |
| 6,738,929 B2 * | 5/2004 | Swoboda et al. .............. | 714/28 |
| 6,751,569 B2 * | 6/2004 | Merkin et al. ............... | 702/120 |
| 6,751,752 B1 * | 6/2004 | Smith .......................... | 714/39 |
| 7,228,472 B2 * | 6/2007 | Johnson et al. ............. | 714/724 |
| 2002/0147943 A1 * | 10/2002 | Slaugh et al. ................. | 714/39 |
| 2002/0194543 A1 * | 12/2002 | Veenstra et al. ............... | 714/39 |
| 2004/0015739 A1 * | 1/2004 | Heinkel et al. ................ | 714/37 |
| 2004/0194067 A1 * | 9/2004 | Lien et al. .................... | 717/129 |
| 2005/0081113 A1 * | 4/2005 | Beard et al. ................... | 714/39 |
| 2005/0183069 A1 * | 8/2005 | Cepulis ...................... | 717/128 |
| 2006/0156102 A1 * | 7/2006 | Johnson et al. ............. | 714/724 |

* cited by examiner

*Primary Examiner*—Scott T Baderman
*Assistant Examiner*—Chae Ko
(74) *Attorney, Agent, or Firm*—Buckley, Maschoff & Talwalkar LLC (57) ABSTRACT

Some embodiments provide configuration of an internal monitoring mechanism of a processing device to output first data associated with a predetermined operational state of the processing device, and loading of control code into the processing device. The control code may be executable by the processing device to output second data associated with input operations and exceptions that occur during execution of test code by the processing device.

19 Claims, 4 Drawing Sheets

DEBUG SYSTEM FOR DATA TRACKING

BACKGROUND

The In-Target Probe (ITP) run-time control tool is used to test functional silicon devices. More specifically, the ITP tool provides examination and manipulation of an architectural state, system memory access, software debugging, chipset resource access, as well as root-cause platform routing and signal integrity evaluations. The ITP tool suite may provide such analysis by attempting to manually correlate a logic state either from a post-failure analysis of stored data from internal registers, memories and Joint Test Access Group (JTAG) scan elements, or by inferring from an execution state as observed from a front-side address, data and control bus. The foregoing approach often does not provide suitable and/or efficient observation of events within a target device, particularly within the debug time span.

A logic analyzer may be coupled to the ITP tool in order to improve the quality of an integrated hardware and software test. The logic analyzer may present all data that is transmitted over the front-side bus during operation of the device. Such an approach is prohibitively expensive for almost all envisioned usage scenarios. Moreover, this approach is often unsuitably inefficient due to the large ratio of presented data to relevant data. Other testing approaches include emitting specific data onto the front side bus using special transactions, writing data to special memory locations for post-test extraction, or writing data to a byte location on the device known as "port 80".

The complexity of target devices continues to increase despite the foregoing limitations in testing systems. The increased complexity may be manifested in many ways, including but not limited to an increased number of processing units one die and a reduction of meaningful coherency between internal execution data and front side bus data. The increasing complexity of target devices and limitations in conventional testing systems present difficult challenges to the low-level software developer.

DETAILED DESCRIPTION

Figure 1:
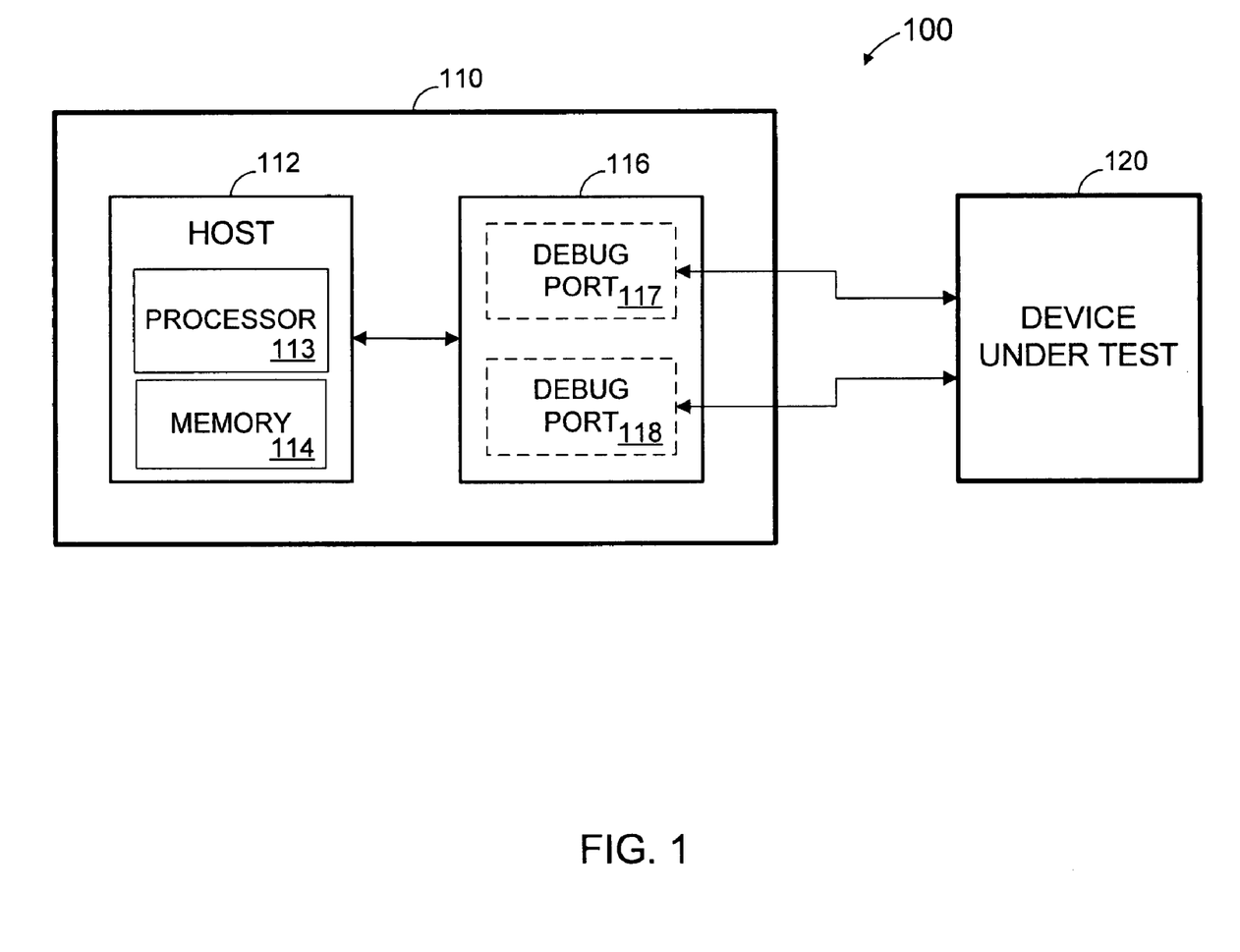
FIG. 1 is a diagram of a system according to some embodiments.

FIG. 1 is a block diagram of system 100 according to some embodiments. System 100 includes debug platform 110 and device under test (DUT) 120. Debug platform 110 may operate to debug and/or otherwise test DUT 120. In some embodiments, debug platform 110 configures an internal monitoring mechanism of DUT 120 to output first data associated with a predetermined operational state of DUT 120, and loads control code into DUT 120. The control code is executable by DUT 120 to output second data associated with input operations and exceptions that occur during execution of test code by DUT 120. Details of the foregoing process according to some embodiments will be provided below.

Debug platform 110 may comprise any combination of hardware and/or software elements, including elements located remotely from one another. As illustrated, such elements compose host 112 and debug tool 116.

Host 112 may comprise a desktop computer or any other suitable system to control a debug/test procedure. Host 112 includes processor 113, which comprises a Pentium®-class microprocessor in some embodiments, and memory 114, which may comprise any suitable memory element to store code for execution by processor 113. Such memory elements may include, but are not limited to, Single Data Rate Random Access Memory and Double Data Rate Random Access Memory. Execution of the code may cause platform 110 to perform actions attributed herein thereto.

Host 112 may also include unillustrated elements necessary for operation thereof. Such elements may include input devices, output devices, communication ports, hard drive storage, application software, operating system software, and device drivers. For example, host 112 may store a testing application for performing the methods described herein, and may store data received during the tests in an internal hard drive. According to some embodiments, host 112 may also store a Real-Time Logic (RTL) simulator to recreate operation of DUT 120 based on the aforementioned received data.

Host 112 is shown in communication with debug tool 116. Debug tool 116 may provide host 112 with hardware and/or software interfaces to DUT 120. For example, debug tool 116 may allow host 112 to configure internal monitoring mechanisms of DUT 120 and may pass data issued by the thusly-configured mechanisms to host 112. Debug tool 116 may also provide an ability to load control code, or "patches", onto DUT 120. DUT 120 may execute the control code to output data associated with input operations and exceptions that occur during execution of test code by DUT 120. This latter data may also be passed from debug tool 116 to host 112.

Debug tool 116 comprises debug port 117 and debug port 118, each of which is in communication with DUT 120 according to the illustrated embodiment. Each of debug ports 117 and 118 may comply with one or more design specifications associated with an ITP tool. Debug port 117 and debug port 118 may share one or more hardware or software elements or may comprise entirely separate systems. Debug ports 117 and 118 may be housed in a same or in separate physical units. Although FIG. 1 illustrates a single link between host 112 and debug tool 116, one or more signal paths of the link may be dedicated to one of debug port 117 and/or debug port 118.

DUT 120 may comprise one or more processing devices, including but not limited to Central Processing Units, and processor cores. DUT 120 may also include a processing device such as a cache structure and an Arithmetic Logic Unit. According to some embodiments, DUT 120 includes internal mechanisms for monitoring states of DUT 120. Such mechanisms may comprise event monitoring logic and registers for implementing such event monitoring.

DUT 120 may include any number of features for facilitating testing thereof. For example, DUT 120 may allow platform 110 to load patch code therein. The patch code may cause DUT 120 to report specific data to debut tool 116 via an auxiliary port. DUT 120 may include JTAG scan chains that may be controlled by debug ports 117 or 118 to shift data in and out of internal processing nodes of DUT 120.

As used herein, systems "in communication" with one another are directly or indirectly capable of communicating over any number of different systems for transferring data, including but not limited to a local area network, a wide area network, a telephone network, a cellular network, a fiber-optic network, a satellite network, an infrared network, a radio frequency network, and any other type of network that may be used to transmit information between devices. Moreover, communication between systems may proceed over any one or more currently or hereafter-known transmission protocols, such as Asynchronous Transfer Mode (ATM), Internet Protocol (IP), Hypertext Transfer Protocol (HTTP) and Wireless Application Protocol (WAP).

Figure 2:
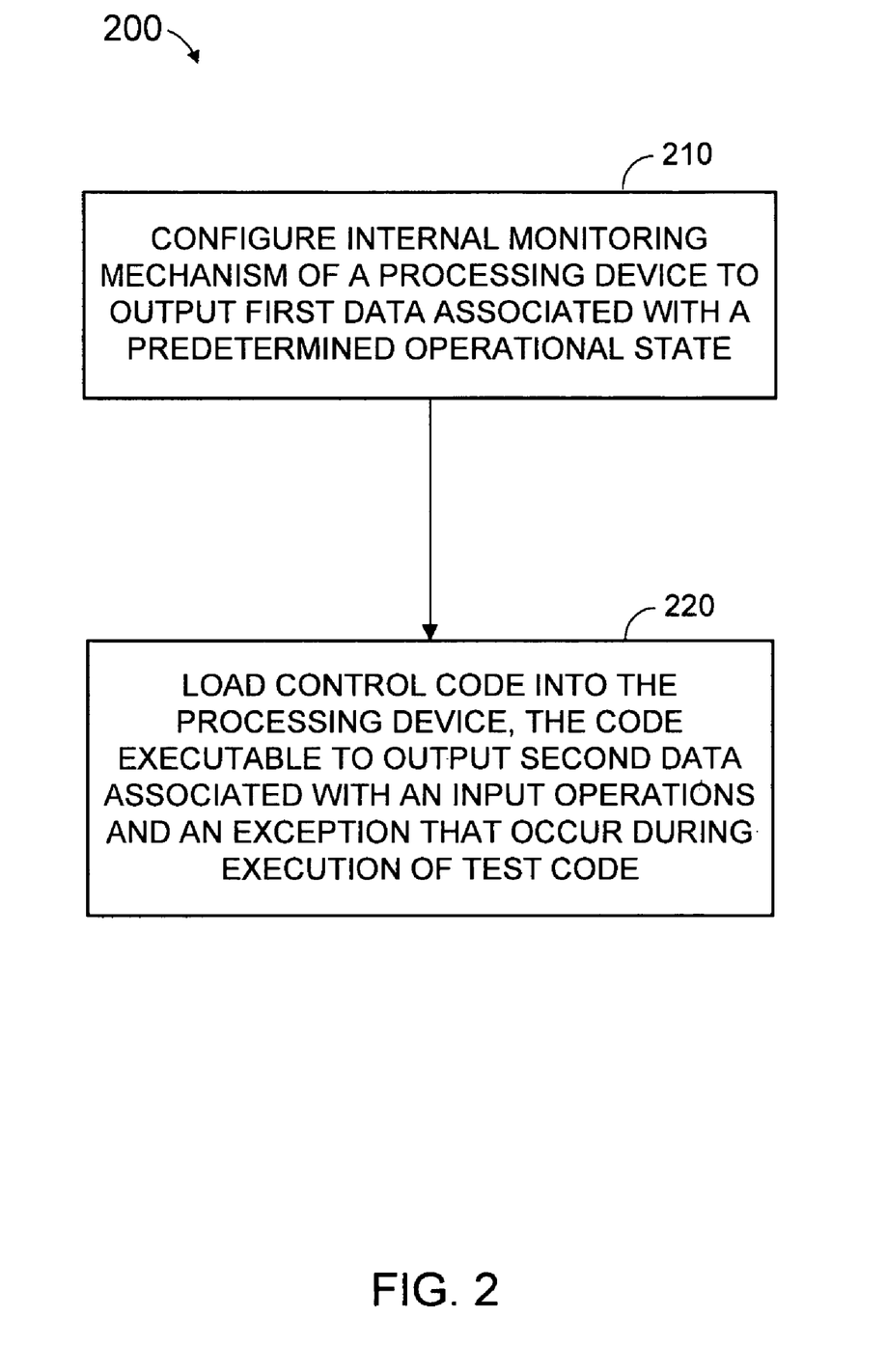
FIG. 2 is a flow diagram of a method according to some embodiments.

FIG. 2 is a general flow diagram of method 200 that may be performed by any suitable system according to some embodiments, including but not limited to system 100. Method 200 may therefore be performed by any combination of hardware and/or software existing in any element of system 100. Some embodiments of method 200 may be practiced in any order that is practicable.

An internal monitoring mechanism of a processing device is configured at 210 to output first data associated with a predetermined operational state of the processing device. Referring to FIG. 1 by way of example, debug platform 110 may configure an internal monitoring mechanism of DUT 120 at 210 by transmitting event monitoring signals to DUT 120. The event monitoring signals may configure DUT 120 to monitor for any event that DUT 120 is capable of monitoring, and may specify a number of times the event is to occur (i.e., a count) before debug platform 110 is notified. The event monitoring signals may comprise breakpoint monitoring (BPM) signals. A more detailed example of event monitoring according to some embodiments will be provided below.

Next, at 220, control code is loaded into the processing device. The code is executable by the processing device to output second data associated with input operations and exceptions that occur during execution of test code. Again turning to FIG. 1, debug platform 110 may modify a patch code area of DUT 120 to load control code according to some embodiments of 220. Any other native control mechanism for loading patch code into DUT 120 may be utilized.

The first data and second data mentioned with respect to method 200 may be received and/or otherwise collected by debug tool 110 in some embodiments. The data may be used to debug a fault represented by the data or for any other suitable purpose.

Figure 3:
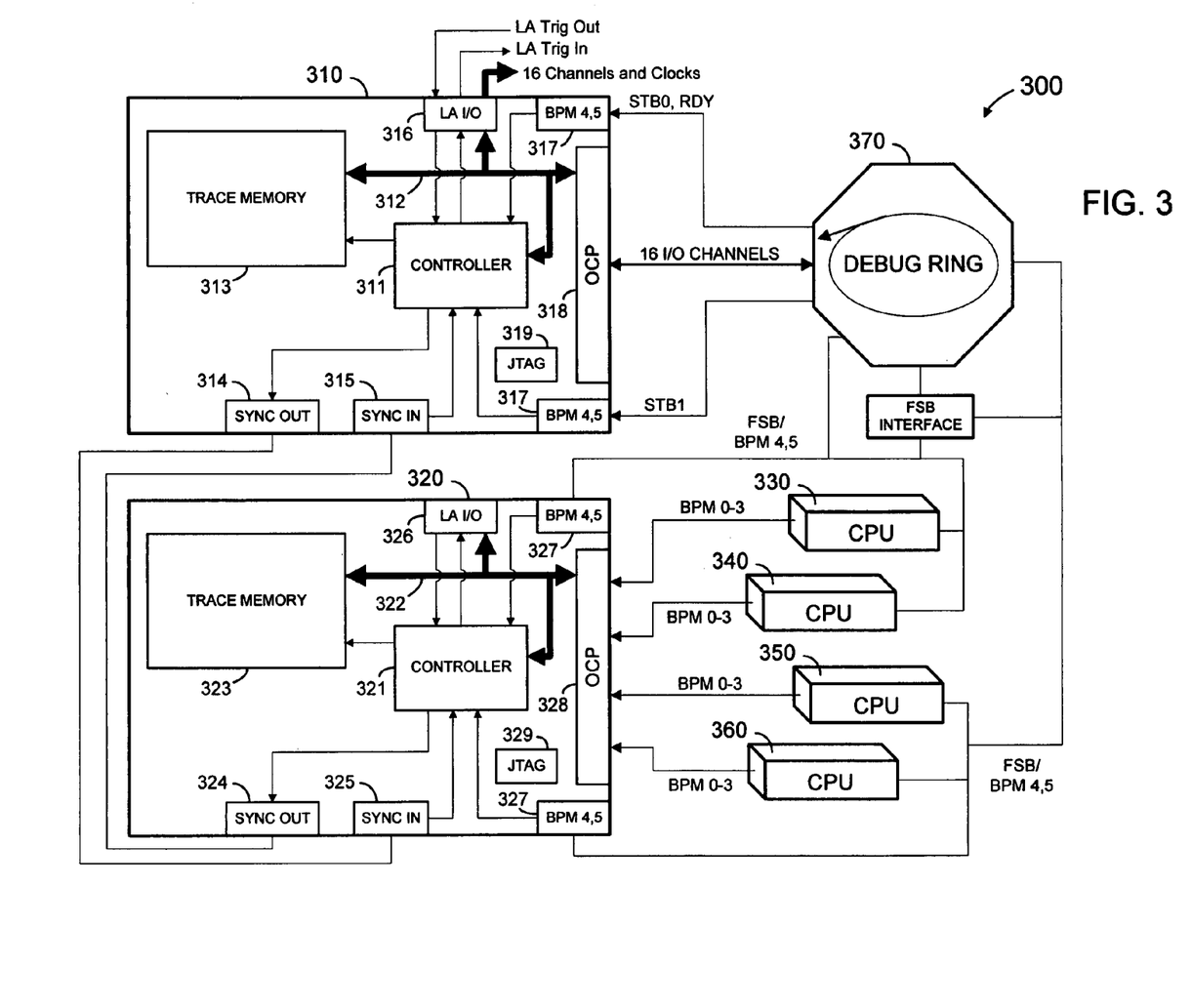
FIG. 3 is a block diagram of a system according to some embodiments.

FIG. 3 is a block diagram illustrating the internal architecture of various elements of system 300 according to some embodiments. System 300 comprises debug port 310, debug port 320, Central Processing Units (CPUs) 330 through 360, and debug ring 370. Debug ports 310 and 320 may comprise instantiations of debug ports 117 and 118 according to some embodiments, while CPUs 330 through 360 may operate as described with respect to DUT 120 above. System 300 may perform method 200 according to some embodiments.

Debug port 310 may comprise any combination of hardware and/or software suitable to perform the functions described herein. Debug port 310 comprises a Field-Programmable Gate Array (FPGA) according to some embodiments. Such an FPGA may be supported with appropriate hardware and software interfaces to elements that are connected thereto.

Debug port 310 includes controller 311 to execute program code for controlling other elements of debug port 310. For example, controller 311 may receive data from bus 312 and may control the transfer of the data to trace memory 313. Trace memory may also store the aforementioned program code. Controller 311 may control timing interfaces 314 and 315 to provide interoperation with debug port 320 as will be described below.

Logic Analyzer interface 316 may also receive the data from bus 312 and output the data to a logic analyzer (not shown) under control of controller 311. As mentioned above, use of a logic analyzer for hardware testing can be expensive and quite inefficient due to the large ratio of presented data to relevant data. In some embodiments, data from bus 312 is also received by a host such as host 112 of FIG. 1.

Controller 311 may receive timing signals from elements 317. Elements 317 are labeled BPM 4,5 because the timing signals received thereby correspond to breakpoint monitoring signals issued by one or more of CPUs 330 through 360. The breakpoint monitoring signals in turn correspond to front-side bus data received by Observation and Control Port (OCP) 318.

JTAG handler 319 provides debug port 310 with known JTAG functionality. In some embodiments, debug port 310 may execute JTAG handler 319 to stop processor execution, to query processor logic, and to issue an instruction. Some embodiments provide one or more additional or alternative serial protocol ports including but not limited to an Inter-Integrated Circuit ($I^2C$) port and a proprietary serial port.

The front-side bus data comprises 16 I/O channels and is received from debug ring 370. Debug ring 370 comprises a 72-bit configurable state machine according to some embodiments. Debug ring 370 may comprise an Intel Northbridge™ chip for supporting front-side bus communication. Some embodiments of system 300 may utilize an entirely different element for debug ring 370, and/or may eliminate debug ring 370 altogether.

Debug ring 370 is coupled to respective front-side busses and breakpoint monitoring signals of CPUs 330 through 360. In this regard, CPUs 330 through 360 may support internal monitoring mechanisms that may be used to collect data associated with the occurrence of selected operational states, or events. According to some embodiments, CPUs 330 through 360 support Model Specific Registers (MSRs) that include performance monitoring registers. These latter registers may include a time stamp counter register, a control and event select register, and two programmable event counters. Some Intel Pentium™ processors are capable of monitoring thirty-eight different events in each performance monitoring register. Some events are counted per occurrence, and counts for others are incremented for each clock cycle during which a particular condition is true.

Observation signal lines of CPUs 330 through 360 are coupled to debug port 320. In the illustrated embodiment, the observation signal lines comprise BPM signal lines. Debug port 320 may thereby receive data from CPUs 330 through 360 that relate to monitored events. For example, debug port 320 may receive data from instruction-based registers of CPU 330 in response to a detected event of CPU 330.

The observation signal lines are coupled to OCP 328 of debug port 320. Accordingly, bus 322 may carry the received data to Logic Analyzer I/O 326 and to trace memory 323. Such data may also be transmitted from port 320 to a host (not shown). Elements 327 of debug port 320 are also coupled to BPM signals of CPUs 330 through 360 in order to control the execution state thereof. Other elements of debug port 320 function similarly as described above with respect to similarly-numbered elements of debug port 310.

Figure 4:
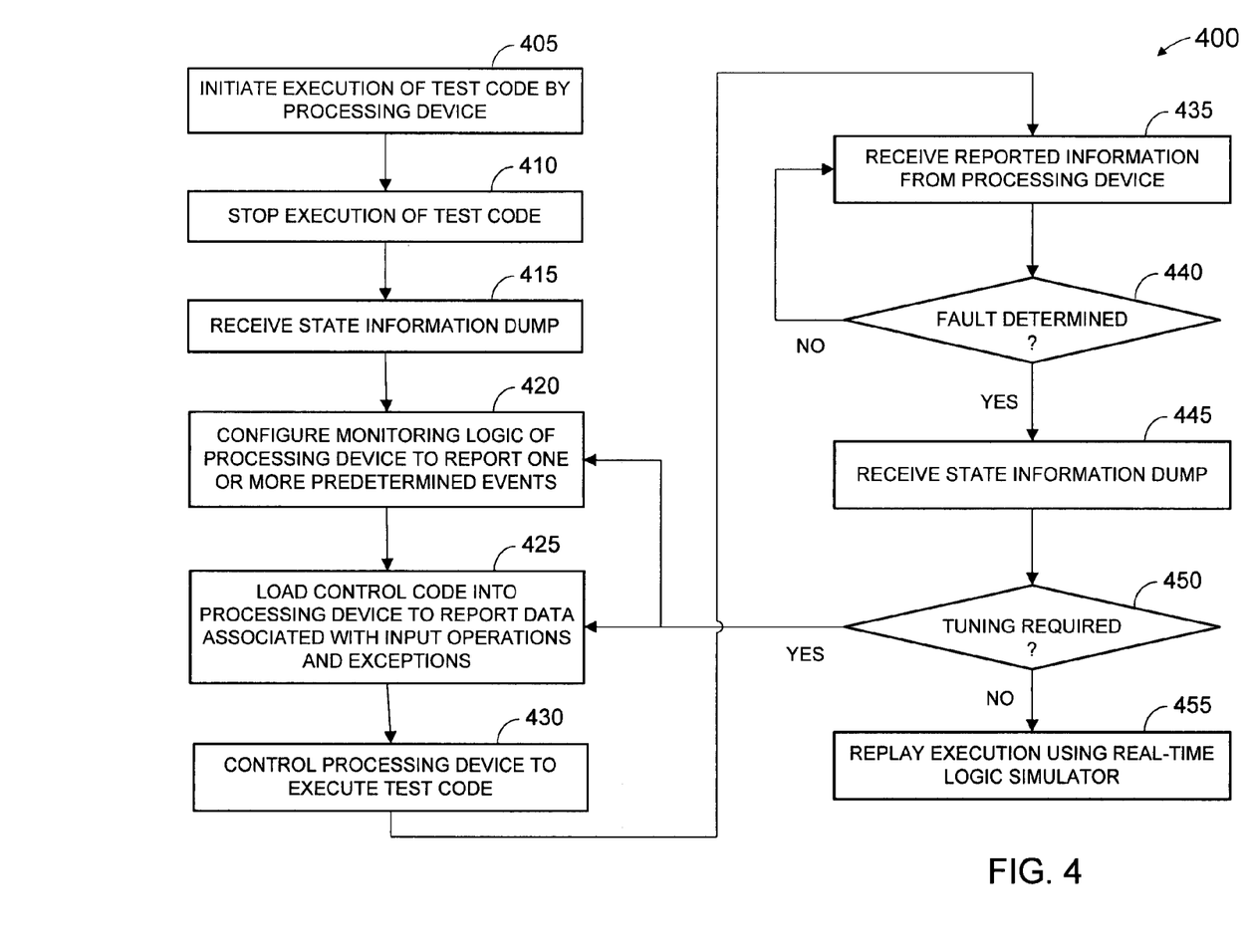
FIG. 4 is a flow diagram of a method according to some embodiments.

FIG. 4 is a flow diagram of method 400 according to some embodiments. Method 400 may be executed by any configuration of hardware and/or software that is or becomes known. An example of method 400 will be provided below with reference to system 100, where debug tool 116 is implemented by debug ports 310 and 320 of system 300. In this regard, method 400 may be performed by host 112, by debug ports 310 and 320 under control of host 112, and/or by debug ports 310 and 320 in response to locally-executed code.

Test code execution by a processing device is initiated at 405. Any suitable system for initiating the execution of code may be employed at 405. In some embodiments, debug port 310 invokes JTAG handler 319 to commence execution of test code by CPUs 330 through 360. JTAG handler 319 may comprise a serial protocol bus (e.g., a JTAG bus) to access internal state and operational resources of the processing devices, to observe a state of the resources, and to collect retained data values. Such execution may be initiated after JTAG handler 319 has previously placed the processing devices in a quiescent state.

Execution of the test code is stopped at 410, and a dump of state information is received at 415. Continuing with the foregoing example, debug port 310 may invoke JTAG handler 319 at 410 to cause a quiescent break in CPUs 330 through 360, and to instruct CPUs 330 through 360 at 415 to report out their instruction-based registers via their BPM pins. The state information dump may be implemented using native code and/or a microcode patch according to some embodiments.

Next, at 420, monitoring logic of the processing device is configured to report one or more predetermined events. The predetermined event(s) may correspond to one or more operational states of the processing device. According to the FIG. 3 embodiment, debug tool 116 configures monitoring logic of CPUs 330 through 360 at 420 by transmitting appropriate BPM signals thereto so as to set values of the aforementioned MSRs. Such configuration instructs CPUs 330 through 360 to output data associated with an operational state that corresponds to the configured registers.

As illustrated in FIG. 3, configuring the monitoring logic may also or alternatively comprise configuring a debug ring to monitor the one or more of CPUs 330 through 360 for occurrence of the event. According to some embodiments, configuring the monitoring logic may comprise one or more of forcing control sequence actions in the processing device, causing an execution change in the processing device, and directly modifying code running in the processing device.

The event (i.e, operational state) may be determined based on the state information dump received at 415. In particular, key indicators may be determined from the state information dump. The key indicators may correspond to one or more operational states of CPUs 330 through 360. Accordingly, the monitoring mechanism is configured at 420 to output data associated with the operational state to which the key indicators correspond.

Control code is loaded into the processing device at 425. The code is executable by the processing device to output second data associated with input operations and exceptions that occur during execution of test code. The control code may be loaded using any native mechanism provided by the processing device for doing so. According to some embodiments, the control code is loaded into a microcode Read Only Memory of the processing device, or into a microcode patch area provided by the device.

The processing device is then controlled at 430 to execute the test code. This control may comprise invocation of a handler as described with respect to 405. During execution of the test code, the processing device outputs the first data and the second data described above based on the configured monitoring logic and the control code, respectively. The first data may be output from BPM pins of the processing device, while the second data may be output from an auxiliary port (e.g., OCP) associated with the processing device.

The reported information (i.e., the first data and the second data) is received at 435. It is then determined, at 440, whether a fault has occurred based on the received information. Any system for identifying a fault may be used at 440. According to some implementations, the predetermined event and loaded control code are intended to generate outputs from which a fault may be easily determined.

If no fault is determined based on the information at 440, flow returns to 435 to continue receipt of any of the first data and second data output by the processing device. Flow therefore cycles between 435 and 440 while the processing device executes test code and until a fault is determined at 440.

A state information dump is received at 445 once a fault is determined at 440. As described above, some embodiments of 445 comprise invoking JTAG handler 319 of debug port 310 to cause a quiescent break in CPUs 330 through 360, and invoking JTAG handler 319 to instruct CPUs 330 through 360 to report out their instruction-based registers via their BPM pins. Other currently- or hereafter-known systems to receive a state information dump may be implemented in some embodiments.

Next, at 450, it is determined whether the configured monitoring logic and/or the control code should be changed or "tuned". The determination may be based on one or more of the received first data, second data, and state information dump. For example, it may be determined at 450 that a particular fault and/or code segment of interest is not adequately modeled by the received data and dump. Therefore, in order to generate data by which the fault and/or code segment may be better modeled (and therefore more efficiently debugged), it may be determined at 450 that tuning is required.

Flow returns to 420 or 425 if tuning is required. According to the embodiment reflected by method 400, flow returns to 420 if tuning of the monitoring logic configuration and the control code is required, and to 425 if only tuning of the control code is required. Of course, some embodiments provide for tuning of the monitoring logic configuration without also requiring tuning of the control code.

Flow proceeds to 455 if it is determined at 450 that no tuning is required. At 455, the execution of the test code is replayed using a Real-Time Logic (RTL) simulator. In some embodiments, processor 113 of host 112 executes an RTL simulator using the received first data, second data and state information dump as inputs. Host 112 may prune the received data prior to executing the RTL simulator according to pruning techniques that are or become known. Some embodiments may provide the first and second data and the state information dump in standardized formats (e.g., MicroSim CMD format and JumpStart format, respectively) suitable for input to the RTL simulator.

Some embodiments of the foregoing provide flexible and low cost data tracking using existing pins that are not part of a target system's native operation. Moreover, some embodiments may reduce the level of inference required for debugging by the above-described targeted data collection.

The several embodiments described herein are solely for the purpose of illustration. Persons in the art will recognize from this description that other embodiments may be practiced with modifications and alterations limited only by the claims.

What is claimed is:

1. A method comprising:
configuring via a first debug port an internal monitoring mechanism of a processing device to output first data associated with a predetermined operational state of the processing device, wherein the processing device comprises a plurality of processors and a plurality of registers associated with the plurality of processors to implement event monitoring, and wherein outputting first data comprises instructing the plurality of processors to output data via a second debug port, the data associated with an operational state that corresponds to the plurality of registers; and loading control code into the processing device, the control code executable by the processing device to output second data via the second debug port, the second data associated with input operations and exceptions that occur during execution of test code by the processing device.

2. A method according to claim 1, further comprising:
controlling the processing device to stop execution of the test code via the first debug port; and
controlling the processing device to output via the second debug port a state information dump from the processing device.

3. A method according to claim 2, further comprising:
receiving the state information dump;
modifying the control code based on the state information dump; and
loading the modified control code into the processing device.

4. A method according to claim 2, further comprising:
receiving the state information dump; and
re-configuring the internal monitoring mechanism based on the state information dump.

5. A method according to claim 2, further comprising:
determining a fault based on the first data and the second data,
wherein controlling the processing device to stop execution of the test code comprises controlling the processing device to stop execution of the test code based on the determination.

6. A method according to claim 5, further comprising:
replaying the fault on a Real-Time Logic simulator using the first data, the second data, and the state information dump.

7. A method according to claim 1, further comprising:
prior to configuring and loading, controlling the processing device to stop execution of the test code;
prior to configuring and loading, controlling the processing device to output a state information dump from the processing device;
determining the pre-defined operational state based on the state information dump; and
determining the control code based on the state information dump.

8. A method according to claim 1, wherein the internal monitoring mechanism comprises event monitoring logic,
wherein the first data is output from breakpoint monitoring pins of the processing device, and
wherein the second data is output from an auxiliary port of the processing device.

9. An apparatus comprising:
a memory storing executable code; and
a plurality of processors, wherein each processor comprises a register to implement event monitoring, and wherein the plurality of processors are operable in conjunction with the code to:
configure via a first debug port an internal monitoring mechanism of a processing device to output first data associated with a predetermined operational state of the processing device, wherein outputting first data comprises instructing the plurality of processors to output data via a second debug port, the first data associated with an operational state that corresponds to their respective register; and load control code into the processing device, the control code executable by the processing device to output second data via the second debug port, the second data associated with input operations and exceptions that occur during execution of test code by the processing device, wherein the first debug port comprises a controller to control timing interfaces and to provide interoperation with the second debug port.

10. An apparatus according to claim 9, the processor further operable in conjunction with the code to:
control the processing device to stop execution of the test code; and
control the processing device to output a state information dump from the processing device.

11. An apparatus according to claim 10, the processor further operable in conjunction with the code to:
receive the state information dump;
modify the control code based on the state information dump; and
load the modified control code into the processing device.

12. An apparatus according to claim 10, the processor further operable in conjunction with the code to:
receive the state information dump; and
re-configure the internal monitoring mechanism based on the state information dump.

13. An apparatus according to claim 10, the processor further operable in conjunction with the code to:
determine a fault based on the first data and the second data,
wherein control of the processing device to stop execution of the test code comprises control of the processing device to stop execution of the test code based on the determination.

14. An apparatus according to claim 13, the processor further operable in conjunction with the code to:
execute a Real-Time Logic simulator to replay the fault using the first data, the second data, and the state information dump.

15. An apparatus according to claim 9, the processor further operable in conjunction with the code to:
prior to configuration and load, control the processing device to stop execution of the test code;
prior to configuration and load, control the processing device to output a state information dump from the processing device;
determine the pre-defined operational state based on the state information dump; and
determine the control code based on the state information dump.

16. An apparatus according to claim 9, wherein the internal monitoring mechanism comprises event monitoring logic,
wherein the first data is output from breakpoint monitoring pins of the processing device, and
wherein the second data is output from an auxiliary port of the processing device.

17. A system comprising:
a microprocessor under test;
a memory storing executable code; and
a plurality of processors, wherein each processor comprises a register to implement event monitoring, and wherein the plurality of processors are operable in conjunction with the code to:
configure via a first debug port an internal monitoring mechanism of a processing device to output first data associated with a predetermined operational state of the processing device, wherein outputting first data comprises instructing the plurality of processors to output data via a second debug port, the data associated with an operational state that corresponds to their respective register; and load control code into the microprocessor, the control code executable by the microprocessor to output second data via the second debug port, the second data associated with input operations and exceptions that occur during execution of test code by the microprocessor.

18. A system according to claim 17, the processor further operable in conjunction with the code to:
control the microprocessor to stop execution of the test code;
control the microprocessor to output a state information dump from the microprocessor;
receive the state information dump;
modify the control code based on the state information dump; and
load the modified control code into the processing device.

19. A system according to claim 17, the processor further operable in conjunction with the code to:
determine a fault based on the first data and the second data;
control the microprocessor to stop execution of the test code;
control the microprocessor to output a state information dump from the microprocessor; and
execute a Real-Time Logic simulator to replay the fault using the first data, the second data, and the state information dump,
wherein control of the processing device to stop execution of the test code comprises control of the processing device to stop execution of the test code based on the determination.

* * * * *

UNITED STATES PATENT AND TRADEMARK OFFICE
CERTIFICATE OF CORRECTION

PATENT NO. : 7,577,876 B2  Page 1 of 1
APPLICATION NO. : 11/169208
DATED : August 18, 2009
INVENTOR(S) : Douglas G. Boyce It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 651 days.

Signed and Sealed this

Seventh Day of September, 2010

David J. Kappos
*Director of the United States Patent and Trademark Office*